(12) United States Patent
Tsuji (10) Patent No.: US 7,101,793 B2
(45) Date of Patent: Sep. 5, 2006

(54) POWER MODULE AND ITS MANUFACTURING METHOD

(75) Inventor: Natsuki Tsuji, Hiroshima (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/105,562

(22) Filed: Apr. 14, 2005

(65) Prior Publication Data

US 2006/0139857 A1 Jun. 29, 2006

(30) Foreign Application Priority Data

Dec. 24, 2004 (JP) .............................. 2004-372984

(51) Int. Cl.
*H01L 21/44* (2006.01)
(52) U.S. Cl. .................................... 438/667
(58) Field of Classification Search .................. 438/38, 438/78, 111, 121, 138, 411, 430, 586, 667, 438/710, 15, 22–27, 33, 42, 106–110, 118–119, 438/123–127, 455, 460, 481, 660; 174/260–267; 29/842–557
See application file for complete search history.

(56) References Cited

U.S. PATENT DOCUMENTS

| | | | | |
|---|---|---|---|---|
| 5,315,280 | A * | 5/1994 | Stokes et al. ................ | 336/192 |
| 6,110,823 | A * | 8/2000 | Eldridge et al. ............ | 438/660 |
| 6,378,774 | B1 * | 4/2002 | Emori et al. ................ | 235/492 |
| 6,390,831 | B1 * | 5/2002 | Shimada et al. ............. | 439/78 |
| 2001/0000498 | A1 * | 4/2001 | Watanabe et al. ............. | 439/66 |
| 2002/0097367 | A1 * | 7/2002 | Hirabayashi ................ | 349/149 |
| 2002/0117330 | A1 * | 8/2002 | Eldridge et al. ............ | 174/260 |
| 2005/0111166 | A1 * | 5/2005 | Kita .......................... | 361/624 |

FOREIGN PATENT DOCUMENTS

| | | |
|---|---|---|
| JP | 9-293941 | 11/1997 |
| JP | 2004-022705 | 1/2004 |
| JP | 2004-087605 | 3/2004 |

* cited by examiner

*Primary Examiner*—Michael Lebentritt
*Assistant Examiner*—Andre' C. Stevenson
(74) *Attorney, Agent, or Firm*—Buchanan Ingersoll & Rooney PC

(57) ABSTRACT

A method of manufacturing a power module is implemented which allows easy electrical connections between a control board and relay terminals. The diameter of through holes in the control board tapers down from a side of penetration of the relay terminals in a direction of the penetration, and respective one ends of the relay terminals have a smaller diameter than the other portions of the relay terminals. The diameter of the through holes on the side of penetration of the relay terminals is made sufficiently greater than the diameter of the one ends of the relay terminals, so that the relay terminals can easily penetrate the through holes. Further, even if the relay terminals are formed in deviated positions, the one ends of the relay terminals can be guided along the walls of the through holes in the penetration, so that the relay terminals can be adjusted to proper positions.

7 Claims, 7 Drawing Sheets

POWER MODULE AND ITS MANUFACTURING METHOD

BACKGROUND OF THE INVENTION

1. Field of the Invention

The present invention relates to a power module used as a power controller, and its manufacturing method.

2. Description of the Background Art

A power module used as a power controller such as a three phase inverter generally includes a power semiconductor device performing switching, and a control board for driving the power semiconductor device.

The power semiconductor device and the control board are electrically connected with relay terminals. More specifically, relay terminals which have previously been electrically connected to the power semiconductor device are caused to penetrate through holes in the control board and soldered to the control board to establish an electrical connection between the power semiconductor device and the control board.

Prior art documents relating to the present invention include the following: Japanese Patent Application Laid-open Nos. 2004-87605, 2004-22705, and 9-293941 (1997).

Conventional power modules have problems such as difficulty in causing relay terminals to penetrate through holes in a control board due to a little freeplay in the diameter of the through holes in the control board relative to the diameter of the relay terminals.

Especially, there are cases in which in the process of causing the relay terminals to penetrate the through holes in the control board, the relay terminals fail to enter the through holes in the control board and then are bent against the surface of the control board. Such bends make more difficult the penetration of the relay terminals into the through holes in the control board and accordingly will require modification of the shape of the relay terminals. This complicates the manufacturing process.

Even if there is no bend in the relay terminals, there are also cases in which the relay terminals are formed in slightly deviated positions and thus less likely to enter the through holes in the control board.

SUMMARY OF THE INVENTION

An object of the present invention is to achieve a method of manufacturing a power module, which allows an easy electrical connection between a control board and a relay terminal.

According to a first aspect of the present invention, the method of manufacturing a power module includes the following steps (a) and (b). The step (a) is to prepare a relay terminal having one end and the other end which is electrically connected to a power semiconductor device, and a control board having a through hole. The step (b) is to cause the one end of the relay terminal to penetrate the through hole. The diameter of the through hole tapers down from a side of penetration of the relay terminal in a direction of the penetration.

Since the diameter of the through hole tapers down from the side of the penetration of the relay terminal in the direction of the penetration, the diameter of the through hole on the side of the penetration of the relay terminal is made sufficiently greater than the diameter of the one end of the relay terminal. Thereby, the relay terminal can easily penetrate the through hole. Further, even if the relay terminal is formed in a deviated position, since the diameter of the through hole tapers down from the side of the penetration of the relay terminal in the direction of the penetration, the one end of the relay terminal can be guided along the wall of the through hole in the penetration. Thereby, the relay terminal can be adjusted to a proper position. This achieves the method of manufacturing a power module, which allows an easy electrical connection between the control board and the relay terminal.

According to a second aspect of the present invention, the method of manufacturing a power module includes the following steps (a) to (e). The step (a) is to prepare at least one relay terminal having one end and the other end which is electrically connected to a power semiconductor device, at least one dummy terminal having one end and the other end which is mountable on and removable from the one end of the relay terminal, and a control board having at least one through hole. The step (b) is to mount the other end of the dummy terminal on the one end of the relay terminal. The step (c) is to cause the one end of the dummy terminal to penetrate the through hole. The step (d) is to cause the one end of the relay terminal to penetrate the through hole by passing the dummy terminal through the through hole. The step (e) is to remove the other end of the dummy terminal from the one end of the relay terminal. The one end of the dummy terminal has a smaller diameter than the other portion of the dummy terminal and than the relay terminal. A boundary portion of the dummy terminal between the one end and the other portion of the dummy terminal has a diameter that tapers down toward the one end of the dummy terminal.

Since the one end of the dummy terminal has a smaller diameter than the other portion of the dummy terminal and than the relay terminal, the one end of the dummy terminal can easily penetrate the through hole in the control board. Further, since the boundary portion of the dummy terminal between the one end and the other portion of the dummy terminal has a diameter that tapers down toward the one end of the dummy terminal, even if the relay terminal is formed in a deviated position, the boundary portion of the dummy terminal can be guided along the through hole in the penetration. Thereby, the relay terminal can be adjusted to a proper position. This achieves the method of manufacturing a power module, which allows an easy electrical connection between the control board and the relay terminal. Besides, only the dummy terminal has a different diameter between its one end and the other portion, and the relay terminal can have a constant diameter. This eliminates the presence of a small-diameter part of the relay terminal and thus can prevent an increase in the resistance value of the relay terminal.

According to a third aspect of the present invention, the method of manufacturing a power module includes the following steps (a) and (b). The step (a) is to prepare a relay terminal having one end and the other end which is electrically connected to a power semiconductor device, and a control board which is divided into first and second members that can be fitted to each other. The step (b) is to sandwich the one end of the relay terminal between the first and second members. At least either of the first and second members has a recess for containing the one end of the relay terminal after the step (b) of sandwiching.

The one end of the relay terminal is sandwiched between the first and second members of the control board which can be fitted to each other, and at least either of the first and second members of the control board is provided with a recess for containing the one end of the relay terminal which have been sandwiched. This achieves the method of manufacturing a power module, which eliminates the process for causing the one end of the relay terminal to penetrate the control board and which allows an easy electrical connection between the control board and the relay terminal.

According to a fourth aspect of the present invention, a power module includes a power semiconductor device, a relay terminal, and a control board. The relay terminal has one end and the other end which is electrically connected to the power semiconductor device. The control board has a through hole. The one end of the relay terminal penetrates the through hole. A diameter of the through hole tapers down from a side of penetration of the relay terminal in a direction of the penetration.

Since the diameter of the through hole tapers down from the side of the penetration of the relay terminal in the direction of the penetration, the diameter of the through hole on the side of the penetration of the relay terminal is made sufficiently greater than the diameter of the one end of the relay terminal. Thereby, the relay terminal can easily penetrate the through hole. Further, even if the relay terminal is formed in a deviated position, since the diameter of the through hole tapers down from the side of the penetration of the relay terminal in the direction of the penetration, the one end of the relay terminal can be guided along the wall of the through hole in the penetration, and accordingly, the relay terminal can be adjusted to a proper position. This achieves the method of manufacturing a power module, which allows an easy electrical connection between the control board and the relay terminal.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

This preferred embodiment provides a power module and its manufacturing method, in which the diameter of through holes in a control board tapers down from a side of penetration of relay terminals in a direction of the penetration, and in which respective one ends of the relay terminals have a smaller diameter than the other portions of the relay terminals.

Figure 1:
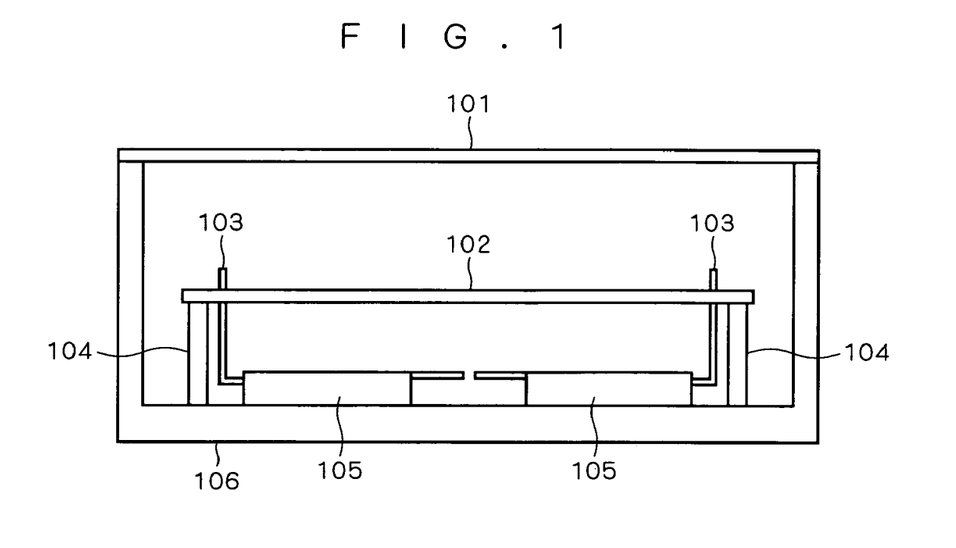
FIG. 1 is a diagram showing a power module manufactured by a manufacturing method according to a first preferred embodiment.

FIG. 1 is a diagram showing a power module manufactured by the manufacturing method according to this preferred embodiment. This power module includes a module cover 101, a control board 102, relay terminals 103, control-board bases 104, power semiconductor devices 105, and a cooling fin 106. The power semiconductor devices 105 are power semiconductor devices such as IGBTs (Insulated Gate Bipolar Transistors) for performing switching, and the control board 102 is a control board equipped with, for example, a control chip (not shown) for driving the power semiconductor devices 105.

As shown in FIG. 1, the power semiconductor devices 105 are secured to the cooling fin 106. The cooling fin 106 also secures the control-board bases 104. The control board 102 is supported by the control-board bases 104. The top side of the cooling fin 106 is covered with the module cover 101.

Figure 2:
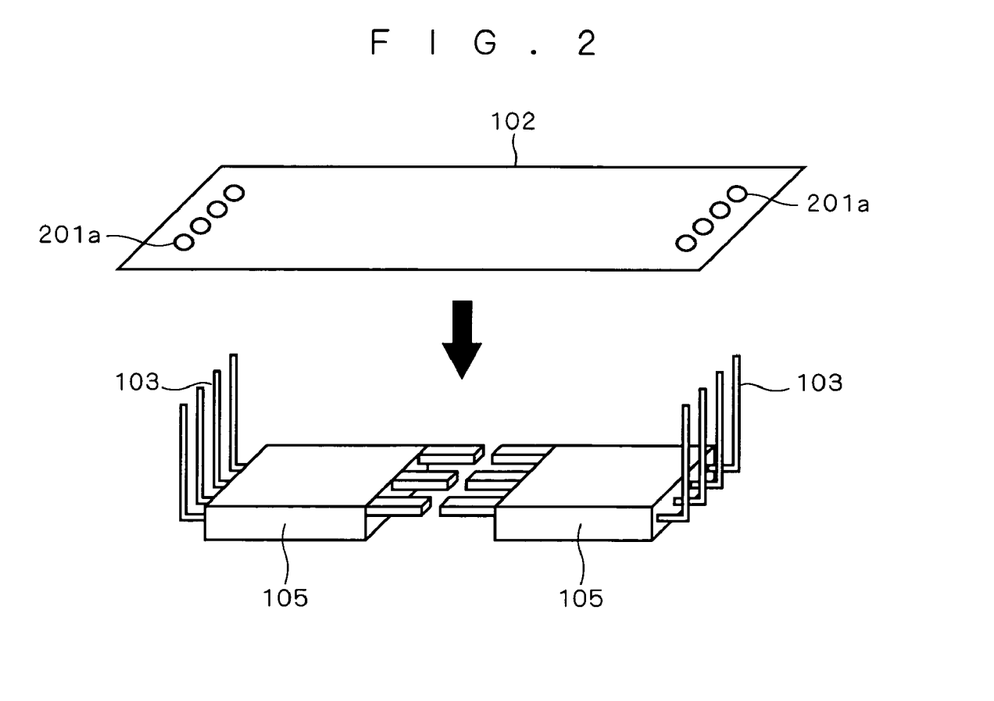
FIGS. 2 and 3 are diagrams for explaining connections of power semiconductor devices, a control board, and relay terminals.
Figure 3:
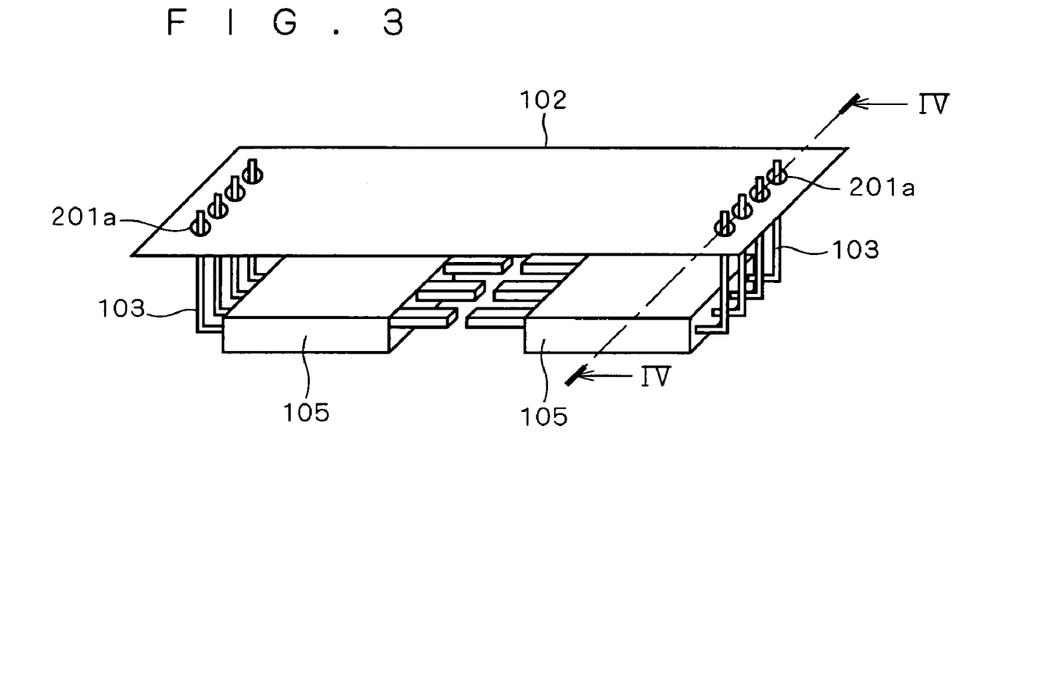

FIGS. 2 and 3 are diagrams for explaining connections of the power semiconductor devices 105, the control board 102, and the relay terminals 103. To simplify the explanation, the components other than the power semiconductor devices 105, the control board 102, and the relay terminals 103 are not shown in FIGS. 2 and 3.

As shown in FIGS. 2 and 3, respective one ends of the relay terminals 103 are caused to penetrate through holes 201a provided in the control board 102. The other ends of the relay terminals 103 have previously been electrically connected and secured to the power semiconductor devices 105.

While this and following preferred embodiments of the present invention show examples of securing the other ends of the relay terminals 103 to the power semiconductor devices 105, the present invention is not limited to those relay terminals. For example, the present invention is also applicable to such relay terminals as shown by reference numeral 5 in FIG. 1 of Japanese Patent Application Laid-open No. 2004-87605 in which relay terminals are separate entities from power semiconductor devices and connected by wires to the power semiconductor devices.

Figure 4:
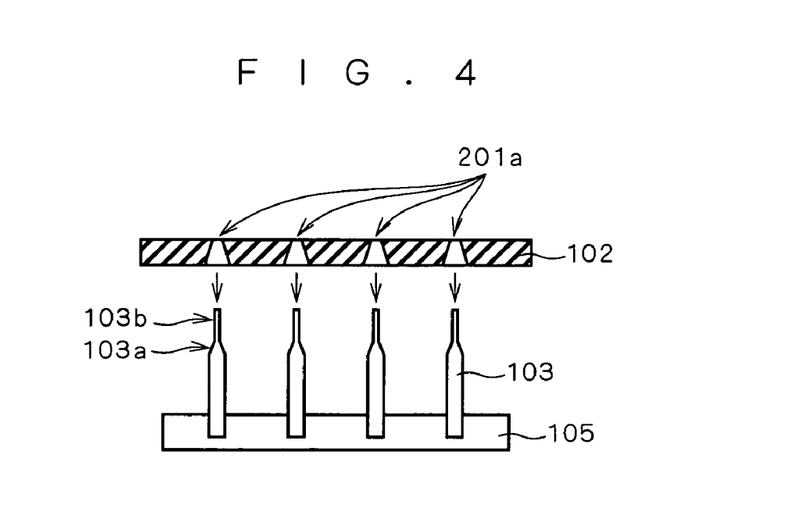
FIGS. 4 and 5 are cross-sectional views taken on the section line IV—IV of FIG. 3.
Figure 5:
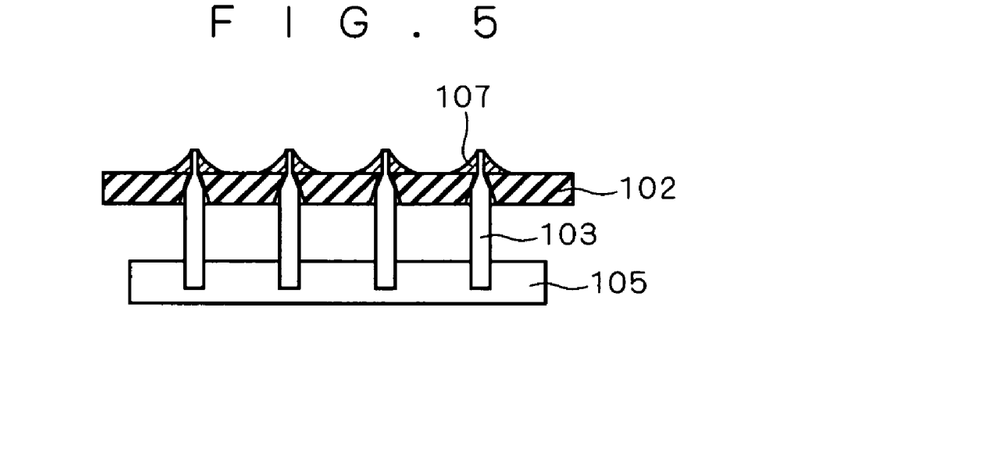

FIGS. 4 and 5 are cross-sectional views taken on the section line IV—IV of FIG. 3. As can be seen from FIG. 4, the diameter of the through holes 201a tapers down from the side of penetration of the relay terminals 103 in the direction of the penetration, so that the sections of the through holes 201a are tapered in the direction of the penetration of the relay terminals 103.

Also, respective one ends 103b of the relay terminals 103 have a smaller diameter than the other portions of the relay terminals 103, and respective boundary portions 103a of the relay terminals 103 between the one ends 103b and the other portion have a diameter that tapers down toward the one ends 103b. Thus, the sections of the boundary portions 103a are also tapered in the direction of the penetration of the relay terminals 103.

After the one ends 103b of the relay terminals 103 penetrate the through holes 201a, as shown in FIG. 5, solder 107 is jet sprayed so that the relay terminals 103 are bonded to the control board 102. This establishes electrical connections between the power semiconductor devices 105 and the control board 102.

In the power module and its manufacturing method according to this preferred embodiment, the diameter of the through holes 201a tapers down from the side of penetration of the relay terminals 103 in the direction of the penetration.

Thus, the diameter of the through holes 201a on the side of the penetration of the relay terminals 103 is made sufficiently greater than the diameter of the one ends 103b of the relay terminals 103, so that the relay terminals 103 can easily penetrate the through holes 201a. Further, even if the relay terminals 103 are formed in deviated positions, since the diameter of the through holes 201a tapers down from the side of penetration of the relay terminals 103 in the direction of the penetration, the one ends 103b of the relay terminals 103 can be guided along the walls of the through holes 201a in the penetration. Thereby, the relay terminals 103 can be adjusted to proper positions. This achieves the method of manufacturing a power module, which allows easy electrical connections between the control board 102 and the relay terminals 103.

Further in the method of manufacturing a power module according to this preferred embodiment, the respective one ends 103b of the relay terminals 103 have a smaller diameter than the other portions of the relay terminals 103. This allows the relay terminals 103 to more easily penetrate the through holes 201a in the control board 102. Further, since the diameter of the respective boundary portions 103a of the relay terminals 103 between the one ends 103b and the other portion tapers down toward the one ends 103b, the tapered-diameter portions of the relay terminals 103 can abut the tapered-diameter portions of the through holes 201a. This allows the tapered-diameter portions of the relay terminals 103 to function as stoppers for the control board 102, thus making it possible to omit the control-board bases 104 that are members provided for supporting the control board 102.

While, in this preferred embodiment, the respective one ends 103b of the relay terminals 103 have a smaller diameter than the other portions of the relay terminals 103, they may not necessarily be like this. Specifically, in another embodiment, only the through holes 201a in the control board 102 may have a different diameter along the direction of penetration of the relay terminals 103 without changing the diameter of the relay terminals 103.

This is because, even if the relay terminals 103 are shaped like simple rods of the same diameter, the guiding effect by the walls of the through holes 201a will be the same as long as the sections of the through holes 201a are tapered as above described.

While this and following preferred embodiments of the present invention show examples of housing all of the control board 102, the relay terminals 103, and the power semiconductor devices 105 within the cooling fin 106, the present invention is not limited thereto. For example, the present invention is also applicable to the case of manufacturing a power module in which the control board 102, the relay terminals 103, and the power semiconductor devices 105 are all plastic sealed packaged.

Second Preferred Embodiment

This preferred embodiment provides a method of manufacturing a power module, which facilitates the penetration of relay terminals into a control board by mounting dummy terminals on the relay terminals and then causing the dummy terminals to penetrate through holes.

Figure 6:
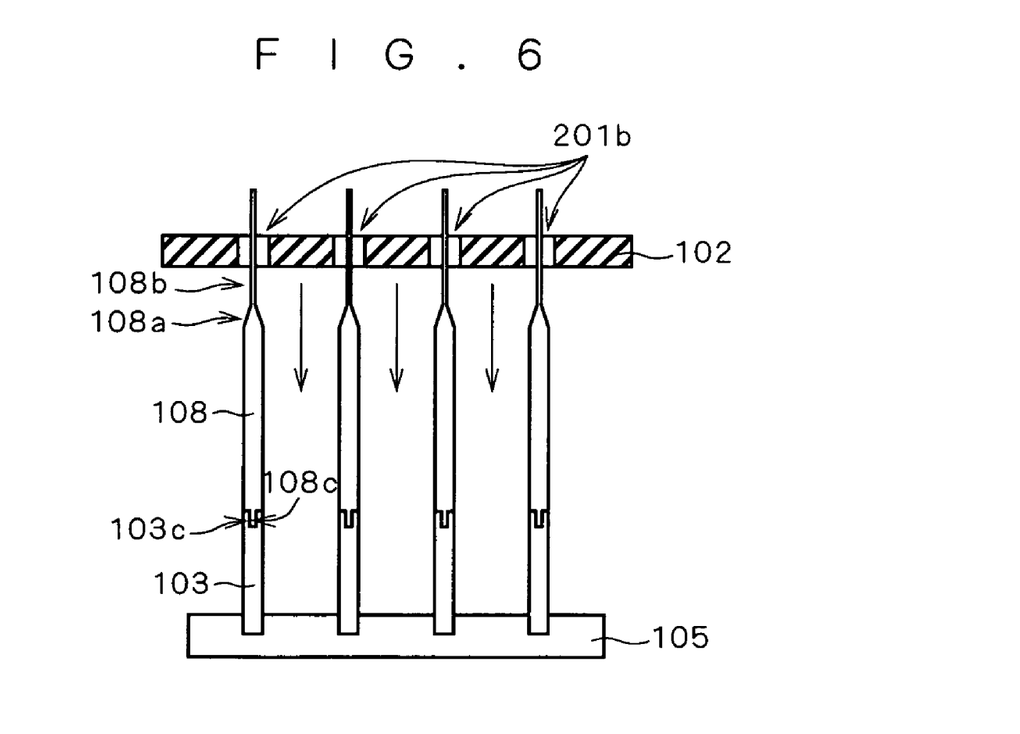
FIGS. 6 and 7 are diagrams illustrating a method of manufacturing a power module according to a second preferred embodiment.
Figure 7:
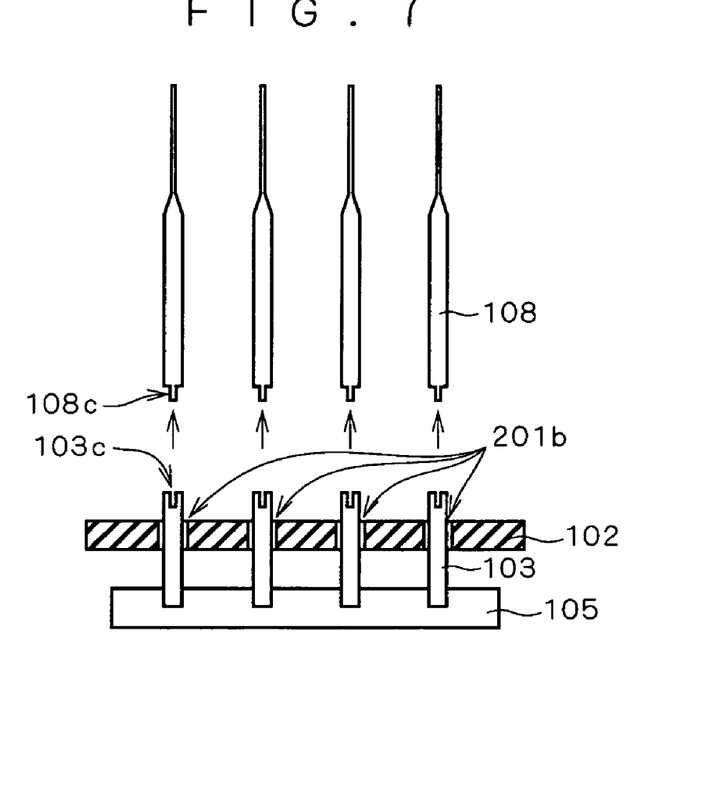
Figure 8:
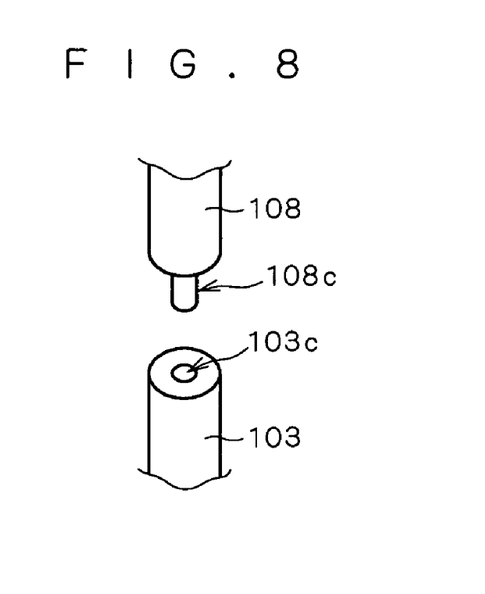
FIG. 8 is an enlarged view of a portion where a dummy terminal is inserted into a relay terminal.

FIGS. 6 and 7 are diagrams illustrating the method of manufacturing a power module according to this preferred embodiment. As shown in the figures, in this preferred embodiment, removable dummy terminals 108 are provided at respective one ends of the relay terminals 103. FIG. 8 is an enlarged view of a portion where one dummy terminal 108 is mounted on one relay terminal 103.

Respective one ends 108b of the dummy terminals 108 have a smaller diameter than the other portions of the dummy terminals 108 and than the relay terminals 103, and respective boundary portions 108a of the dummy terminals 108 between the one ends 108b and the other portion have a diameter that tapers down toward the one ends 108b. The other ends of the dummy terminals 108 are mountable on and removable from one ends of the relay terminals 103. Here, the one ends 108b of the dummy terminals 108 serve as insertion points into through holes 201b in the control board 102.

In this preferred embodiment, first of all, the other ends of the dummy terminals 108 are mounted on the one ends of the relay terminals 103. More specifically, as shown in FIG. 8, male parts 108c provided at the other ends of the dummy terminal 108 are fitted into female parts 103c provided at the one ends of the relay terminals 103.

Then, as shown in FIG. 6, the one ends 108b of the dummy terminals 108 are caused to penetrate the through holes 201b in the control board 102. Unlike in the case of the through holes 201a in the first preferred embodiment, the diameter of the through holes 201b according to this preferred embodiment remains unchanged along the direction of the penetration of the dummy terminals 108.

Then, by passing the dummy terminals 108 through the through holes 201b, the one ends of the relay terminals 103 are caused to penetrate the through holes 201b. Thereafter, as shown in FIG. 7, the other ends of the dummy terminals 108 are removed from the one ends of the relay terminals 103.

In the method of manufacturing a power module according to this preferred embodiment, the respective one ends 108b of the dummy terminals 108 have a smaller diameter than the other portions of the dummy terminals 108 and than the relay terminals 103. Thus, the one ends 108b of the dummy terminals 108 can easily penetrate the through holes 201b in the control board 102.

Also, since the boundary portions 108a of the dummy terminals 108 between the one ends 108b and the other portion has a diameter that tapers down toward the one ends 108b, even if the relay terminals 103 are formed in deviated positions, the boundary portions 108a of the dummy terminals 108 can be guided along the through holes 201b in the penetration. Thereby, the relay terminals 103 can be adjusted to proper positions. This achieves the method of manufacturing a power module, which allows easy electrical connections between the control board 102 and the relay terminals 103.

Further, only the dummy terminals 108 have a different diameter between their respective one ends 108b and their other portions, and the relay terminals 103 have a constant diameter. This eliminates the presence of a small-diameter part of the relay terminals 103 and thus can prevent an increase in the resistance values of the relay terminals 103.

Third Preferred Embodiment

This preferred embodiment provides a modification of the method of manufacturing a power module according to the second preferred embodiment, in which the dummy terminals 108 are mounted on only some of the plurality of relay terminals 103 in the second preferred embodiment.

Figure 9:
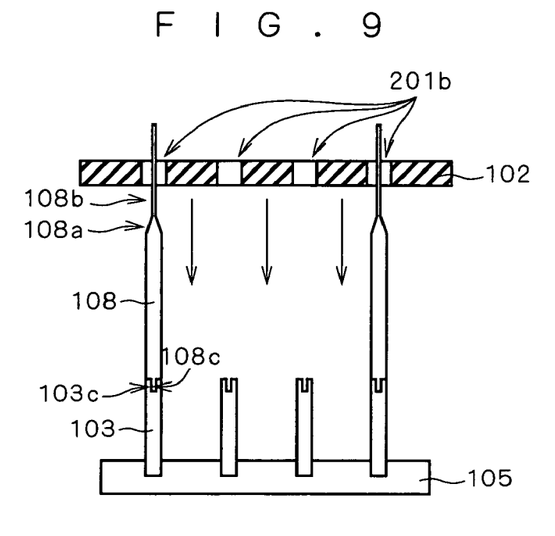
FIG. 9 is a diagram illustrating a method of manufacturing a power module according to a third preferred embodiment.
Figure 10:
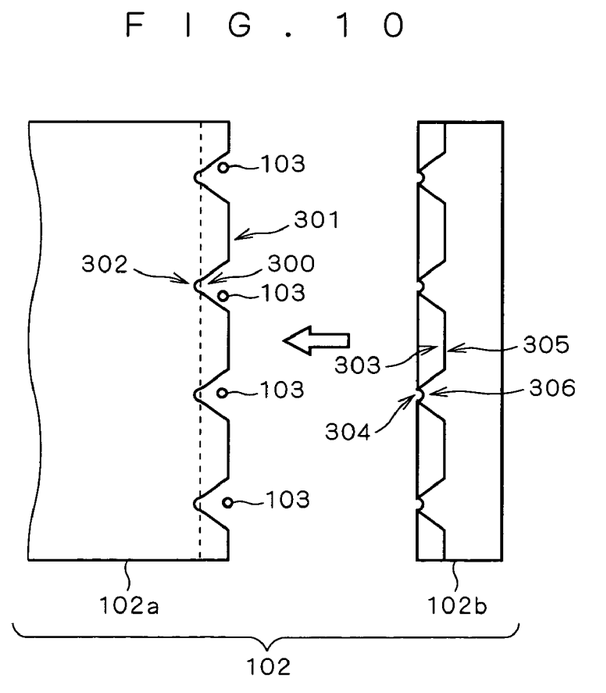
FIG. 10 is a diagram illustrating a method of manufacturing a power module according to a fourth preferred embodiment.

FIG. 9 is a diagram illustrating the method of manufacturing a power module according to this preferred embodiment. FIG. 9 is identical to FIG. 6, except that the dummy terminals 108 are mounted on only the relay terminals 103 at both edges and not mounted on two relay terminals 103 in the center.

In the method of manufacturing a power module according to this preferred embodiment, the dummy terminals 108 are mounted on only some of the plurality of relay terminals 103. This avoids the necessity of mounting and removing the dummy terminals 108 on and from all of the relay terminals 103, thus simplifying the method of manufacturing a power module according to the second preferred embodiment.

Fourth Preferred Embodiment

This preferred embodiment provides a method of manufacturing a power module, in which electrical connections between a control board and relay terminals can be established by sandwiching respective one ends of the relay terminals by the control board which is divided into first and second members that can be fitted to each other.

Figure 11:
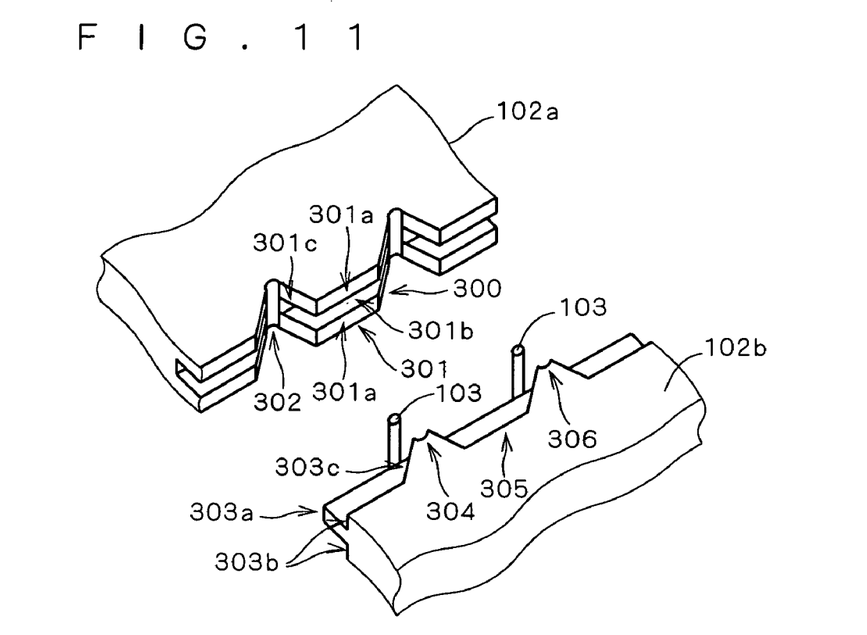
FIG. 11 is a perspective view illustrating the method of manufacturing a power module according to the fourth preferred embodiment.
Figure 12:
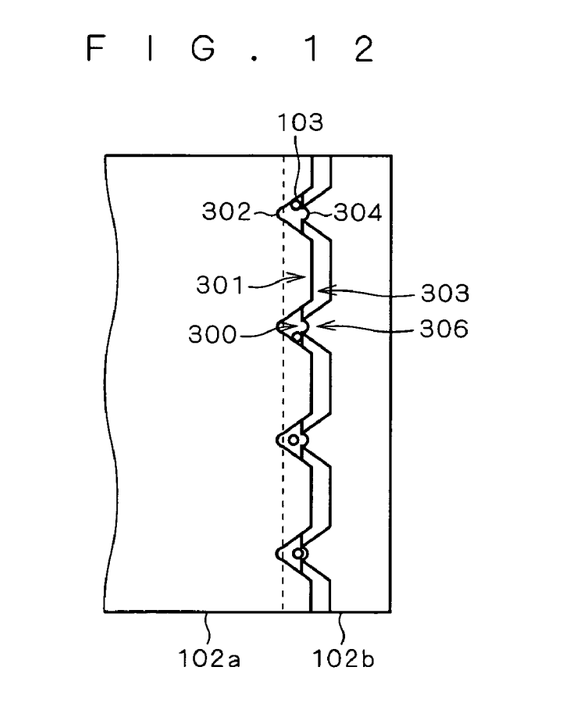
FIGS. 12 and 13 are diagrams illustrating the method of manufacturing a power module according to the fourth preferred embodiment.
Figure 13:
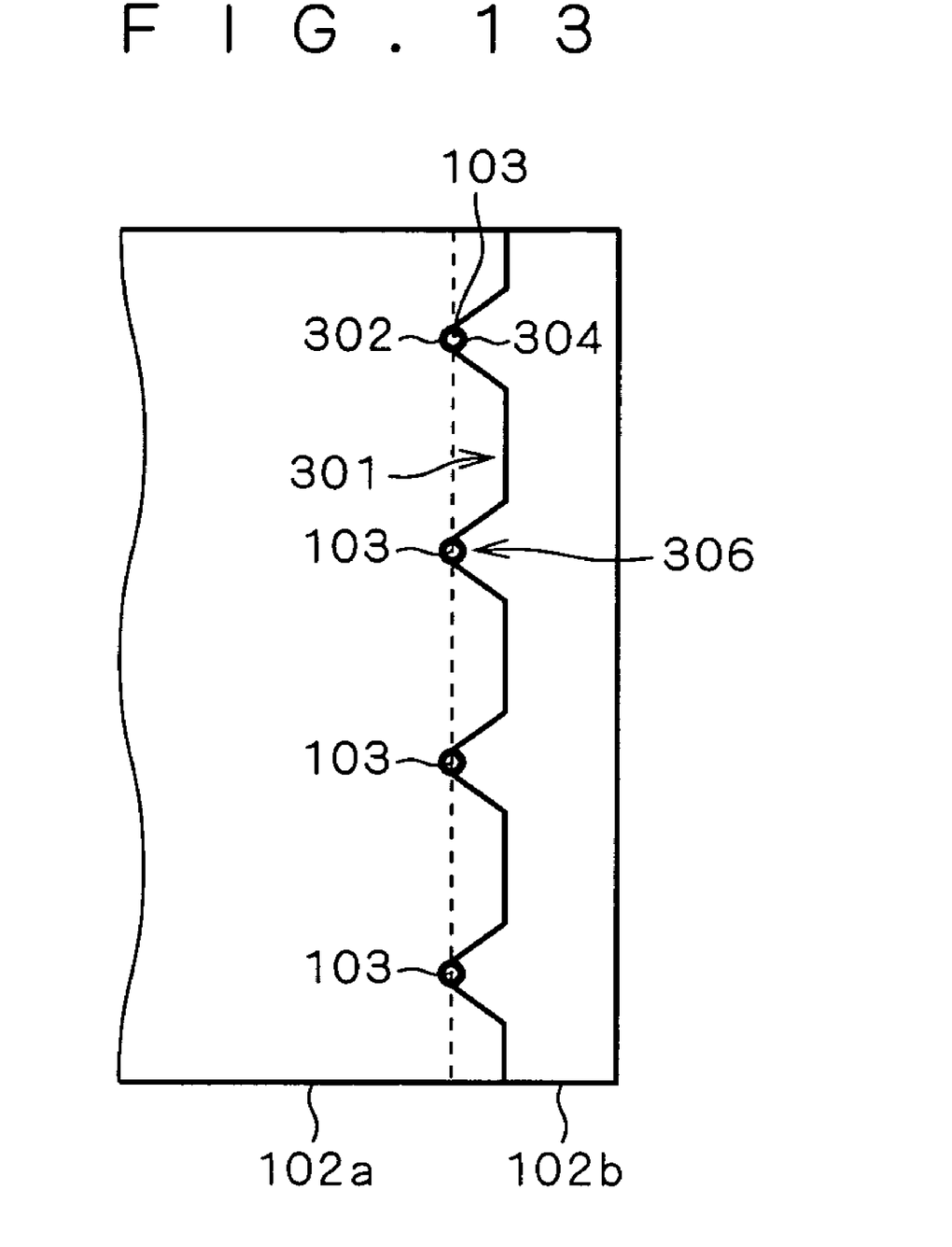

FIGS. 10 to 13 are diagrams illustrating the method of manufacturing a power module according to this preferred embodiment. FIG. 11 is a perspective view of FIG. 10. FIG. 12 shows the state during fitting of the first and second members, and FIG. 13 shows the state after completion of the fitting of the first and second members.

FIGS. 10 to 13 show the first and second members 102a and 102b of the control board 102 and the relay terminals 103 according to this preferred embodiment. In those figures, respective one ends of the relay terminals 103 are sandwiched between the first and second members 102a and 102b.

The first and second members 102a and 102b are provided with recesses 302 and 304, respectively, for containing the respective one ends of the relay terminals 103 which have been sandwiched.

As another alternative, only either of the recesses 302 and 304 may be provided for containing the respective one ends of the relay terminals 103.

One edge 301 of the first member 102a is provided with divergent notches 300 that widen toward the edge 301, and one edge 305 of the second member 102b is provided with convergent projections 306 that are fitted into the notches 300 when sandwiching the relay terminals 103. The above recesses 302 are provided in the deepest points of the notches 300, and the above recesses 304 are provided in the tips of the projections 306.

The edge 305 of the second member 102b is also provided with plate portions 303 which are located adjacent to the projections 306 and which protrudes from the edge 305 by the same distance as a projection distance from the edge 305 to the tips of the projections 306. The edge 301 of the first member 102a is also provided with storage portions 301b which are located adjacent to the notches 300 and which store the plate portions 303 when sandwiching the relay terminals 103 (see FIG. 11).

More specifically, as shown in FIG. 11, at the edge 301 of the first member 102a, the storage portions 301b are provided between two edge faces 301a which are vertically spaced in a direction of the thickness of the first member 102a. Tapered faces 301c of the edge 301 form the notches 300. The recesses 302 are provided in the deepest points of the tapered faces 301c.

The plate portions 303 of the second member 102b are formed of portions 303a which protrude from between edge faces 303b of the edge 305 which are vertically spaced in a direction of the thickness of the second member 102b. Tapered faces 303c of the edge 305 form the projections 306. The recesses 304 are provided in the tips of the tapered faces 303c.

After the relay terminals 103 are sandwiched between the first and second members 102a and 102b as shown in FIG. 13, as in the case of the first preferred embodiment, the relay terminals 103 are bonded to the control board 102 by jet spraying solder around the relay terminals 103. This establishes electrical connections between the power semiconductor devices 105 and the control board 102.

In the method of manufacturing a power module according to this preferred embodiment, the respective one ends of the relay terminals 103 are sandwiched between the first and second members 102a and 102b of the control board 102 which can be fitted to each other, and the first and second members 102a and 102b of the control board 102 are provided with the recesses 302 and 304, respectively, for containing the respective one ends of the relay terminals 103 which have been sandwiched. The method can thus eliminate the process for causing the respective one ends of the relay terminals 103 to penetrate the control board 102, thereby allowing easy electrical connections between the control board 102 and the relay terminals 103.

Further in the method of manufacturing a power module according to this preferred embodiment, the edge 301 of the first member 102a is provided with the notches 300, and the edge 305 of the second member 102b is provided with the projections 306. The recesses 302 are provided in the deepest points of the notches 300, and the recesses 304 are provided in the tips of the projections 306. This allows the respective one ends of the relay terminals 103, when sandwiched between the first and second members 102a and 102b, to be guided by the notches 300 and thus to be readily contained in the recesses 302 and 304.

Further in the method of manufacturing a power module according to this preferred embodiment, the edge 305 of the second member 102b is provided with the plate portions 303 located adjacent to the projections 306, and the edge 301 of the first member 102a is provided with the storage portions 301b located adjacent to the notches 300. This allows the respective one ends of the relay terminals 103, when sandwiched between the first and second members 102a and 102b, to be guided by also the plate portions 303 and thus to be more readily contained in the recesses 302 and 304.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a power module, comprising the steps of:
 (a) preparing at least one relay terminal having one end and the other end which is electrically connected to a power semiconductor device, at least one dummy terminal having one end and the other end which is mountable on and removable from said one end of said relay terminal, and a control board having at least one through hole;
 (b) mounting said the other end of said dummy terminal on said one end of said relay terminal;
 (c) causing said one end of said dummy terminal to penetrate said through hole;
 (d) causing said one end of said relay terminal to penetrate said through hole by passing said dummy terminal through said through hole; and
 (e) removing said the other end of said dummy terminal from said one end of said relay terminal, wherein
 said one end of said dummy terminal has a smaller diameter than any other portion of said dummy terminal and than said relay terminal, and a boundary portion of said dummy terminal between said one end and said other portion of said dummy terminal has a diameter that tapers down toward said one end of said dummy terminal.

2. The method of manufacturing a power module according to claim 1, wherein said relay terminal includes a plurality of relay terminals, said through hole includes a plurality of through holes, and in said step (b), said dummy terminal is inserted into some of said plurality of relay terminals.

3. A method of manufacturing a power module, comprising the steps of:
(a) preparing a relay terminal having one end and the other end which is electrically connected to a power semiconductor device for switching, and a control board for driving the power semiconductor device, the control board having a through hole; and
(b) causing said one end of said relay terminal to penetrate said through hole, wherein a diameter of said through hole tapers down from a side of penetration of said relay terminal in a direction of the penetration.

4. The method of manufacturing a power module according to claim 3, wherein said one end of said relay terminal has a smaller diameter than the other portion of said relay terminal, and a boundary portion of said relay terminal between said one end and said other portion has a diameter that tapers down toward said one end.

5. A method of manufacturing a power module, comprising the steps of:
(a) preparing a relay terminal having one end and the other end which is electrically connected to a power semiconductor device for switching, and a control board for driving the power semiconductor device, the control board is divided into first and second members that can be fitted to each other; and
(b) sandwiching said one end of said relay terminal between said first and second members, wherein at least either of said first and second members has a recess for containing said one end of said relay terminal after said step (b) of sandwiching.

6. The method of manufacturing a power module according to claim 5, wherein said first member has an edge provided with a divergent notch that widens toward said edge, said second member has an edge provided with a convergent projection that is fitted into said notch in said step (b) of sandwiching, and said recess is provided at least either in a deepest part of said notch or in a tip of said projection.

7. The method of manufacturing a power module according to claim 6, wherein said edge of said second member is provided with a plate portion which is located adjacent to said projection and which protrudes from said edge of said second member by the same distance as a projection distance from said edge of said second member to said tip of said projection, and said edge of said first member is provided with a storage portion which is located adjacent to said notch and which stores said plate portion in said step (b) of sandwiching.

* * * * *